(12) United States Patent
Phan et al.

(10) Patent No.: US 7,838,429 B2
(45) Date of Patent: Nov. 23, 2010

(54) METHOD TO MANUFACTURE A THIN FILM RESISTOR

(75) Inventors: Tony Phan, Flower Mound, TX (US);
Kyle M. Flessner, Richardson, TX (US);
Martin B. Mollat, McKinney, TX (US);
Connie Wang, Plano, TX (US); Arthur Pan, Plano, TX (US); Eric William Beach, Tucson, AZ (US); Michelle R. Keramidas, Garland, TX (US); Karen Elizabeth Burks, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 376 days.

(21) Appl. No.: 11/779,465

(22) Filed: Jul. 18, 2007

(65) Prior Publication Data
US 2009/0023263 A1    Jan. 22, 2009

(51) Int. Cl.
*H01L 21/302* (2006.01)
(52) U.S. Cl. .................. 438/704; 257/E21.222

(58) Field of Classification Search .......... 257/E21.222, 257/E21.252, E21.31; 438/704, 706, 738
See application file for complete search history.

(56) References Cited

U.S. PATENT DOCUMENTS

| 6,620,659 B2 * | 9/2003 | Emmma et al. ............. 438/154 |
| 6,716,746 B1 * | 4/2004 | Kim et al. .................... 438/637 |
| 7,214,550 B2 | 5/2007 | Phan et al. |
| 2007/0128758 A1 * | 6/2007 | Tanaka et al. ................. 438/50 |

* cited by examiner

*Primary Examiner*—David Vu
(74) *Attorney, Agent, or Firm*—Warren L. Franz; Wade J. Brady, III; Frederick J. Telecky, Jr.

(57) ABSTRACT

A method for manufacturing a semiconductor device that method comprises forming a thin film resistor by a process that includes depositing a resistive material layer on a semiconductor substrate. The process also includes depositing an insulating layer on the resistive material layer, and performing a first dry etch process on the insulating layer to form an insulative body. The process further includes performing a second dry etch process on the resistive material layer to form a resistive body. The resistive body and the insulative body have substantially identical perimeters.

14 Claims, 13 Drawing Sheets

METHOD TO MANUFACTURE A THIN FILM RESISTOR

TECHNICAL FIELD

The disclosure is directed, in general, to manufacturing semiconductor devices, and more specifically, to manufacturing thin film resistors for semiconductor devices, and to the devices manufactured therefrom.

BACKGROUND

Thin film resistors (TFR) are often used in semiconductor devices (e.g., integrated circuits) that perform analog-to-digital and digital-to-analog conversions. It is important for the TFR to provide a precise resistance with small variability from one TFR to the next. To be conducive to the high packing densities desired in the semiconductor industry, it is also important that the TFR have scalable submicron dimensions (e.g., about 0.35 micron or smaller dimensions). The resistivity of the TFR can be controlled by selecting the material of its resistive body (e.g., selecting doped polysilicon or metals) or by adjusting the size of the resistive body. As device dimensions decrease, polysilicon resistive bodies are being replaced by smaller-sized metal resistive bodies.

SUMMARY

The disclosure provides a method for manufacturing a semiconductor device. The method comprises forming a thin film resistor by a process that includes depositing a resistive material layer on a semiconductor substrate. The process also includes depositing an insulating layer on the resistive material layer and performing a first dry etch process on the insulating layer to form an insulative body. The process further includes performing a second dry etch process on the resistive material layer to form a resistive body. The resistive body and the insulative body have substantially identical perimeters.

Another embodiment of the method comprises forming transistors on a semiconductor substrate and forming one or more thin film resistors on the semiconductor substrate. At least one of the thin film resistors is manufactured by the above-described process. The method also comprises covering the resistive body and the insulative body with a second insulating layer and forming openings in the second insulating layer and insulative body. The openings expose opposite ends of the resistive body. The openings are filled with metal to form interconnects. The interconnects couple the resistive body to at least one of the transistors or another of the thin film resistors. The method also comprises depositing one or more interlayer insulating layers on the semiconductor substrate. The transistors and the thin film resistor are covered by at least one of the insulating layers. The method further comprises forming interlayer interconnects through one or more of the interlayer insulating layers. The interlayer interconnects couple the transistors to each other, or to the at least one thin film resistor.

BRIEF DESCRIPTION OF DRAWINGS

The disclosure is described with reference to example embodiments and to accompanying drawings, wherein.

DETAILED DESCRIPTION

U.S. Pat. No. 7,214,550, to Phan et al. ("Phan"), incorporated by reference herein in its entirety, describes a TFR fabrication process. Phan's fabrication process relies on the use of a titanium tungsten (TiW) hardmask as part of forming a metallic resistive body using a dry etch patterning process. The use of the dry etch process instead of a wet etch process reduces the formation of jagged edges on the resistive body, as further discussed in Phan. Consequently, TFRs with more uniform resistances can be produced.

Because the TiW hardmask is located on the resistive body and is electrically conductive, it is substantially removed from the final device structure. E.g., end portions of the TiW hardmask are covered with an Al head masking layer and then the uncovered portions of the TiW are removed by a wet or dry etch process (see Phan).

It was discovered, as part of the present disclosure, that after the TiW hardmask is removed, the exposed portion of the resistive body is susceptible to oxidation. E.g., the exposed portion of the resistive body can be oxidized when a photoresist layer is removed using a high temperature ash process (e.g., about 200° C. in an oxygen-containing atmosphere). Oxidation can alter the resistive body's resistance and interface resistance to adjoining metal interconnects, thereby resulting is a higher-than-desired noise (e.g., 1/f noise) in the TFR.

The present disclosure benefits from the discovery that the TiW hardmask can be replaced with an insulating body. The use of an insulating body instead of a TiW hardmask provides several benefits. Because the insulating body does not conduct electricity, it can be left on the resistive body. Leaving the insulating body on the resistive body, in turn, obviates the need to form a TiW hardmask, to form an Al head masking layer, and to then remove portions of the TiW hardmask. Moreover, because the insulating body remains on the resistive body, the resistive body is protected against oxidation.

FIGS. 1-8 show cross-sectional and plan views of an example semiconductor device 100 of the disclosure at selected stages of manufacture. Some embodiments of the device 100 comprise an analog-to-digital converter or digital-to-analog converter. In some embodiments, the TFR of the disclosure is included in a resistive ladder network of such converters.

Figure 1:
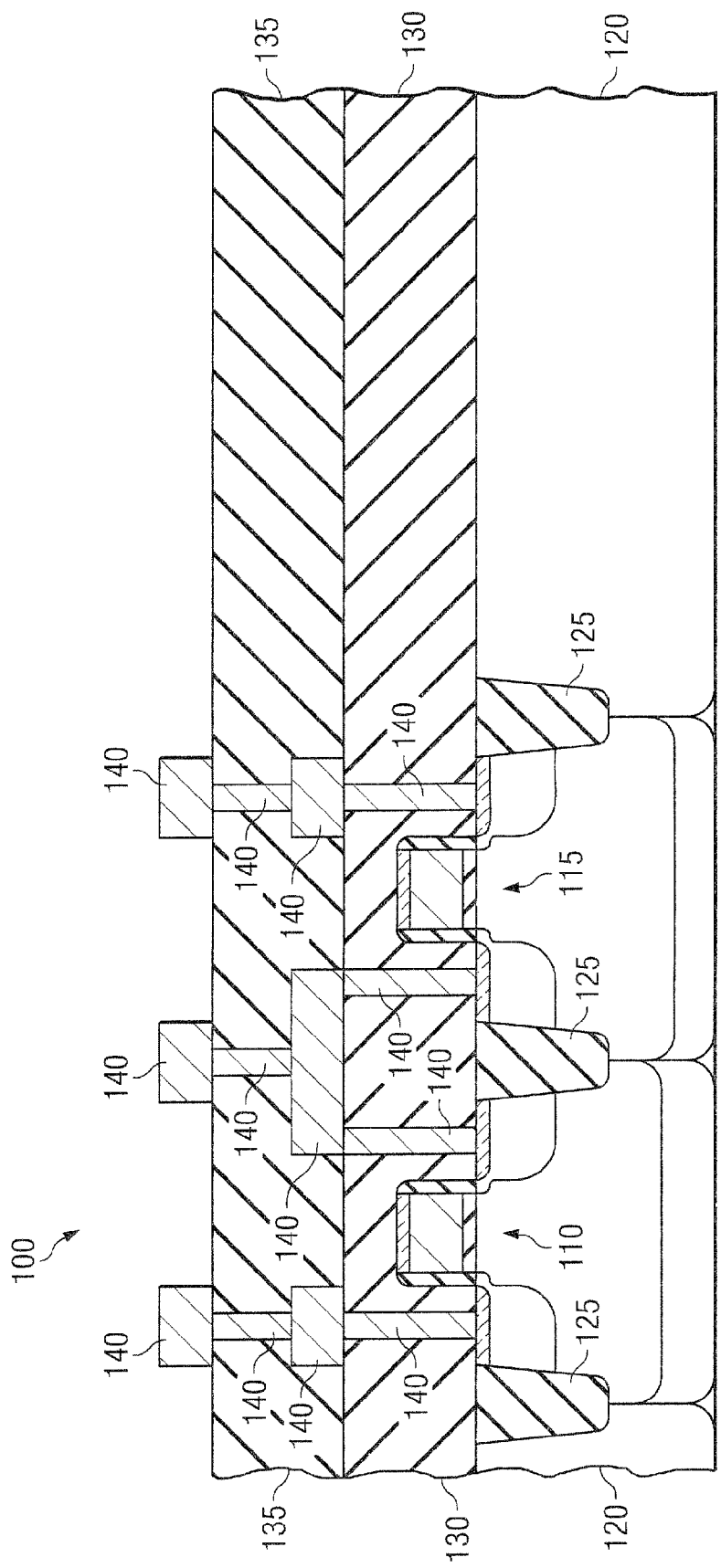
FIGS. 1-8 show cross-sectional and plan views, at various stages of manufacture, of example semiconductor devices according to the principles of the present disclosure.

FIG. 1 shows a cross-sectional view of the device 100 after forming transistors 110, 115 on a semiconductor substrate 120 (e.g., a silicon, silicon-on-insulator or other conventional wafer substrate). Any conventional techniques can be used to form the transistors 110, 115. The transistors 110, 115 can include nMOS or pMOS transistors, Junction Field Effect transistors, NPN or PNP bipolar transistors, biCMOS transistors, or combinations thereof. In some cases the transistors form part of an operational amplifier of the device 100. Isolation regions 125 (e.g., shallow trench isolation structures or field oxide structures) in or on the substrate 120 can electrically isolate the transistors 110, 115 from each other.

FIG. 1 also shows the device 100 after forming one or more insulating layers, e.g., a pre-metal dielectric (PMD) layer 130 and first interlevel dielectric layer (IDL) 135 on the substrate 120 such that the transistors 110, 115 are covered by the insulating layers 130, 135. The insulating layers 130, 135 can be composed of silicon dioxide, undoped or doped silicate glass, spin-on-glass, fluorosilicate glass or other low-dielectric constant material (e.g., a dielectric constant of less than about 4) and deposited by conventional procedures, such as chemical vapor deposition (CVD), or other conventional techniques. E.g., in some cases insulating layers 130, 135 include a layer of silicon dioxide deposited from tetraethyl orthosilicate (TEOS). In other cases the insulating layers 130, 135 may include of a low K dielectric material deposited by spin coating, CVD or other conventional procedures.

FIG. 1 further shows the device 100 after forming interlayer interconnects 140 through one or more of the interlayer insulating layers 130, 135. Dry or wet etch methods can be used to form openings (vias, trenches or lines, including single or dual damascene structures) in the insulating layers 130, 135. The openings can then be filled with metal (e.g., tungsten, copper) using PVD, CVD or other conventional techniques. Alternatively, a metal layer (e.g., Al) can be deposited on the insulating layers 130, 135 and then patterned to form interconnects 140 using conventional dry etching processes. The interconnects 140 can couple the transistors 110, 115 to each other, or to TFRs, at least one of the TFRs being manufactured by the process described below.

FIGS. 2-5B show selected steps in the formation of a TFR 200 of the device 100. The term "thin film resistor" or "TFR" as used herein refers to a fixed passive resistor having a resistive body 510. In some cases TFR refers to a metallic resistive body 510. However nonmetallic resistive bodies 510 could be used. In some cases the TFR refers to a metallic resistive body 510 having a thickness 515 of about 100 nanometers or less (FIG. 5A). In some cases, thickness 515 of greater than 50 nm occupy more vertical space in the device 100 than desired. E.g., in some cases the thickness 515 is 50 nanometers or less. In the example process to follow, the TFR is formed within a second IDL. One skilled in the art would understand that the process could be adapted to form the TFR at other locations or levels in a semiconductor device. E.g., the TFR 200 can be formed on or within other IDLs (e.g., IDL 135), on the PMD layer 130, or on an isolation region 125 of the device 100.

Figure 2:
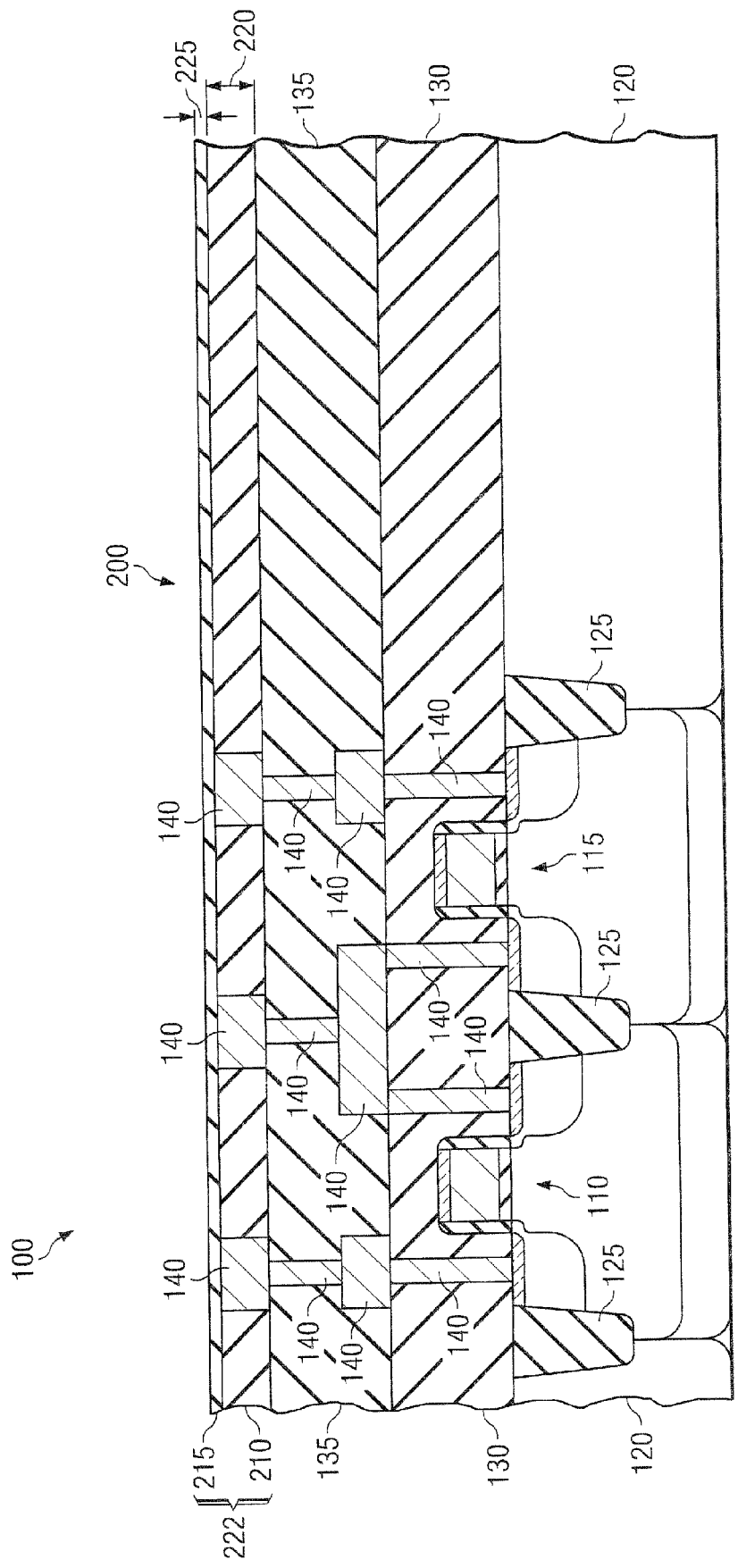

FIG. 2 shows a cross-sectional view of the device 100 after depositing an insulating layer 210 and insulating cap layer 215 on the semiconductor substrate 120. The insulating layer 210 and insulating cap layer 215 can be deposited using the same techniques and comprise the same materials as described for the insulating layers 130, 135 in the context of FIG. 1. Some embodiments of the insulating layer 210 can have a thickness 220 of about 1200 to 1600 nm and be part of a second interlayer dielectric layer 222. Some embodiments of the cap layer 215, which can also be part of the second IDL 222, can have a thickness 225 of about 90 to 110 nm. The cap layer 215 serves to provide a planar surface on which to manufacture the TFR 200. The cap layer 215 is desirable in cases where the insulating layer 210 has surface irregularities or non-planarities, e.g., irregularities or non-planarities introduced after having its thickness 220 adjusted. E.g., the insulating layer 210 can be chemically-mechanically polished or etched-back to the level of a metal interconnect 140 formed on the first IDL 135.

Figure 3:
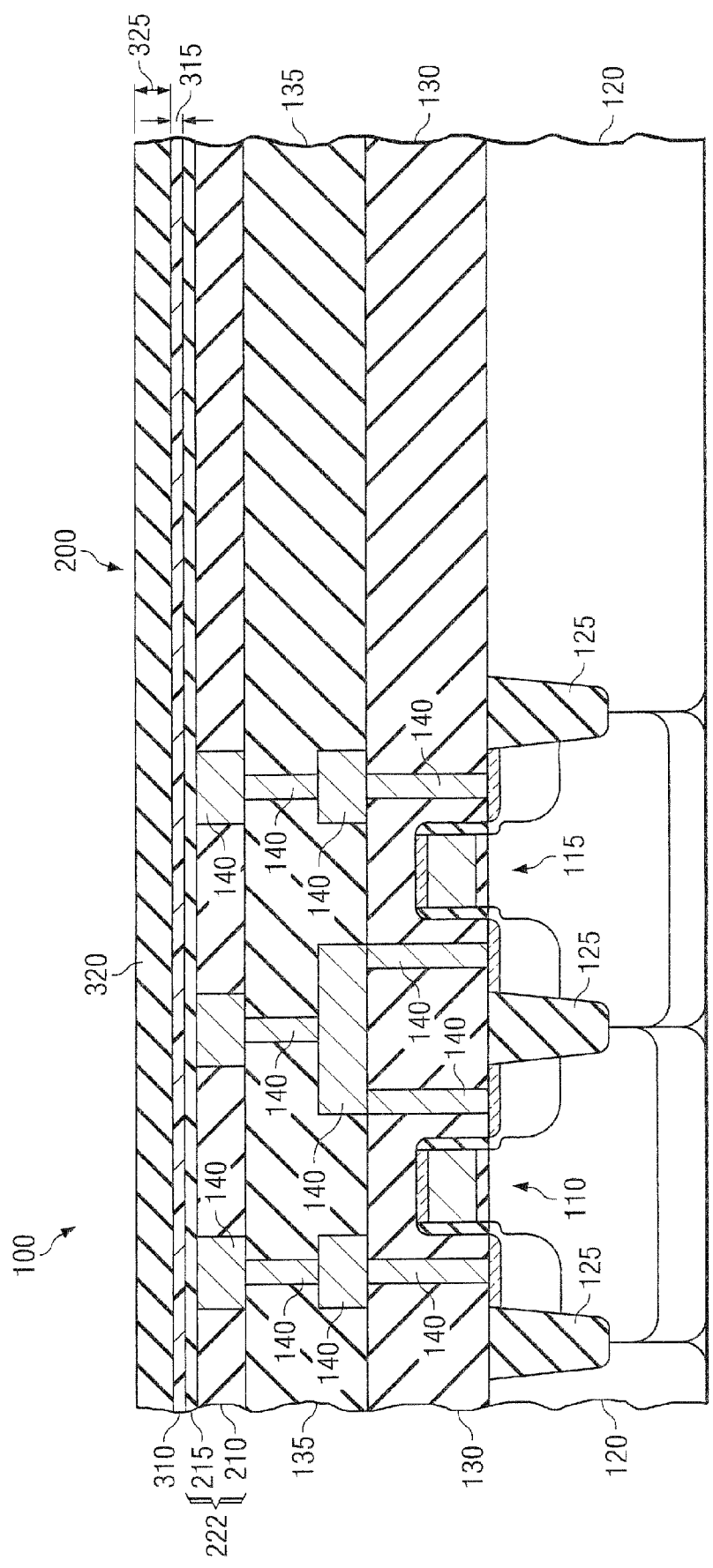

FIG. 3 shows a cross-sectional view of the device 100 after depositing a resistive material layer 310 on the semiconductor substrate 120 (e.g., on the cap layer 215 or insulating layer 210). E.g., a physical vapor deposition (PVD) process such as evaporation or sputtering can be used to deposit the resistive material layer 310. Depositing the layer 310 can include annealing the layer 310 (e.g., at about 410° C. in air for about 30 minutes followed by at about 410° C. in a forming gas (e.g. 20% $H_2$ balance $N_2$) for about 30 minutes).

The composition and thickness 315 of the layer 310 is carefully selected and controlled to provide the TFR 200 with its desired predefined resistance. Desirable resistive materials for the layer 310 include NiCr, SiCr or TaN. These materials are desirable because they have a low temperature coefficient of resistance (e.g., equal to or less than about 30 ppm/° C.) and because they are capable of having their resistance tuned by a conventional laser trimming process. In some embodiments, the layer's 310 thickness 315 is about 100 nm or less, and in some cases 50 nm or less. In some cases, the thickness 315 ranges from about 2 to 30 nm (e.g., SiCr and TaN containing TFRs) and in other cases about 2 to 15 nm (e.g., NiCr containing TFRs).

FIG. 3 also shows the device 100 after depositing an insulating layer 320 on the resistive material layer 310. E.g., in some embodiments, silane and tetraethyl orthosilicate (TEOS) source gases can be used to form a silicon oxide insulating layer using a low pressure CVD process, atmospheric CVD or other conventional process. In other embodiments, the insulating layer can comprise silicate glass, such as undoped silicate glass. In still other embodiments the insulating layer 320 comprises silicon nitride, silicon oxynitride, silicon carbide or multilayer combinations thereof.

It is important for the insulating layer 320 to have a thickness 325 in the range of about 20 to 80 nanometers, and more preferably, about 25 to 35 nm. In cases when the insulating layer's 320 thickness 325 is less than 20 nm, openings (e.g., pin-hole defects) can be present in the insulating layer 320. An oxidizing agent (e.g., an oxidizing agent used in a photoresist ashing process) can penetrate through the openings and oxidize the resistive material, thereby altering the TFR's 200 resistance. In cases where the insulating layer's 320 thickness 325 is greater than 80 nm, there can be sufficiently large differences in the topology over the layer 320 to deter the reliable formation of contacts to the patterned resistive material layer 310.

Figure 4A:
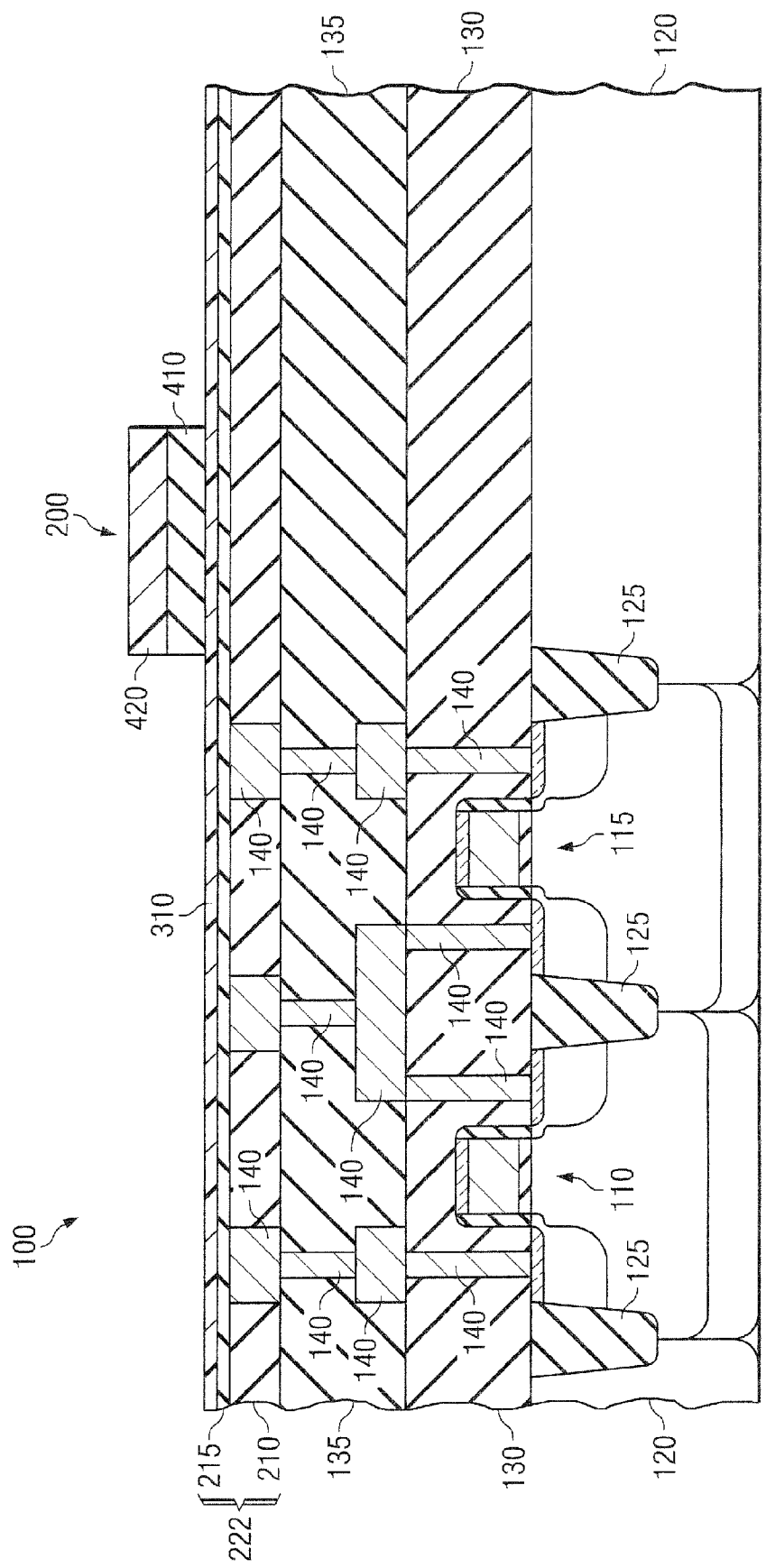

FIG. 4A shows a cross-sectional view of the device 100 after performing a first dry etch process on the insulating layer 320 (FIG. 3) to form an insulative body 410. Forming the insulative body 410 can include depositing a photoresist layer and patterning the layer to form a patterned photoresist layer 420 located on the insulating layer 320 (FIG. 3), using conventional photolithographic procedures. The patterned photoresist layer 420 serves as a mask for the dry etch process used to form the insulative body 410.

Figure 4B:
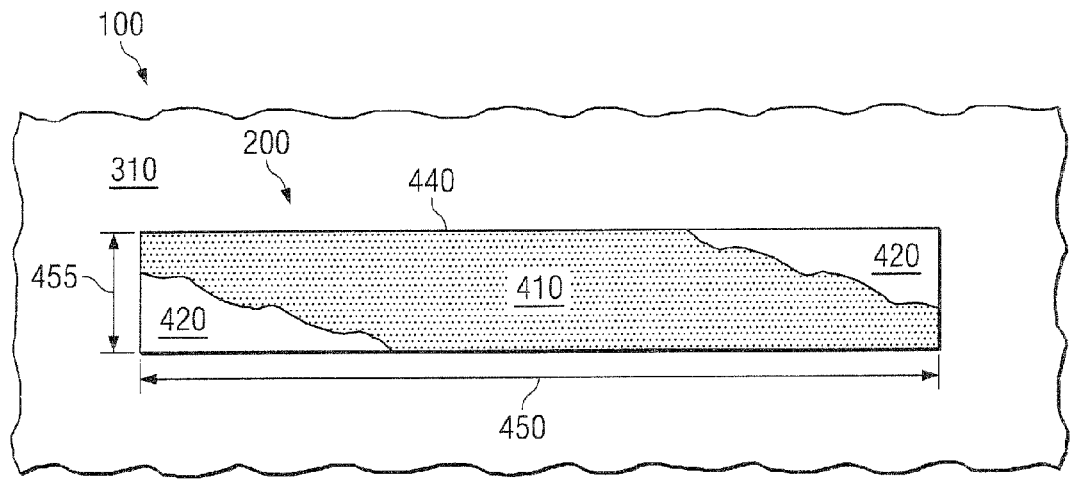

FIG. 4B shows a higher magnification plan view of the example device 100 at the same stage in the manufacturing process as FIG. 4A, with portions of the patterned photoresist layer 420 cut away to illustrate the perimeter 440 of the underlying insulative body 410. Some embodiments of the insulative body 410 have a length 450 of about 10 to 50 microns and a width 455 of about 0.2 to 20 microns (FIG. 4B).

To avoid the formation of an insulative body 410 having jagged edges, the first dry etch is preferably a sputter etch that uses a physical momentum transfer to remove those portions of the insulating layer 320 (FIG. 3) that are not covered by the patterned photoresist layer 420. To provide good sputtering efficiency, first dry etch gases with a high molecular mass and low flow rates are selected. E.g., some embodiments of the first dry etch process include flowing $BCL_3$ and $SF_6$ gases at flow rates of about 200 sccm or less. Higher flows rates than 200 sccm can make the dry etch more isotropic than desired. E.g., some embodiments of the first dry etch process include flowing $BCL_3$ and $SF_6$ gases at flow rates ranging from about 10 to 200 sccm. E.g., other embodiments of the first dry etch process include flowing $BCL_3$ and $SF_6$ gases at flow rates ranging from about 30 to 50 sccm and about 35 to 45 sccm, respectively. In some cases the dry etch process consists essentially of a flow of $BCL_3$ and $SF_6$. That is, there are substantially no other components in the gas flow delivered at about 1 sccm or greater. The top RF power and bottom RF power are also selected to control the plasma density and to determine the sputtering power, respectively. E.g., in some embodiments, a top RF power equal to a range of about from 300 W to 500 W and a bottom RF power equal to a range of about from 100 W to 200 W are applied.

Figure 5B:
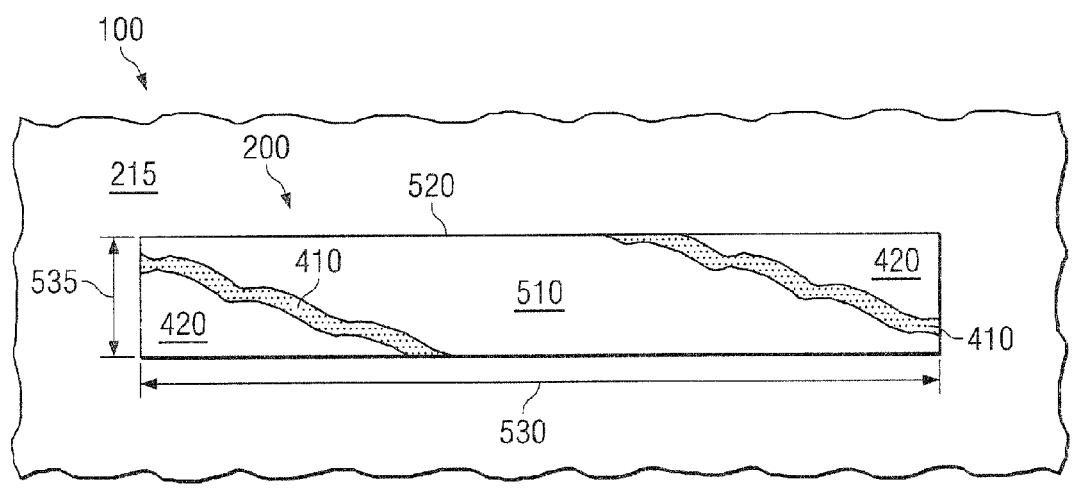
Figure 5A:
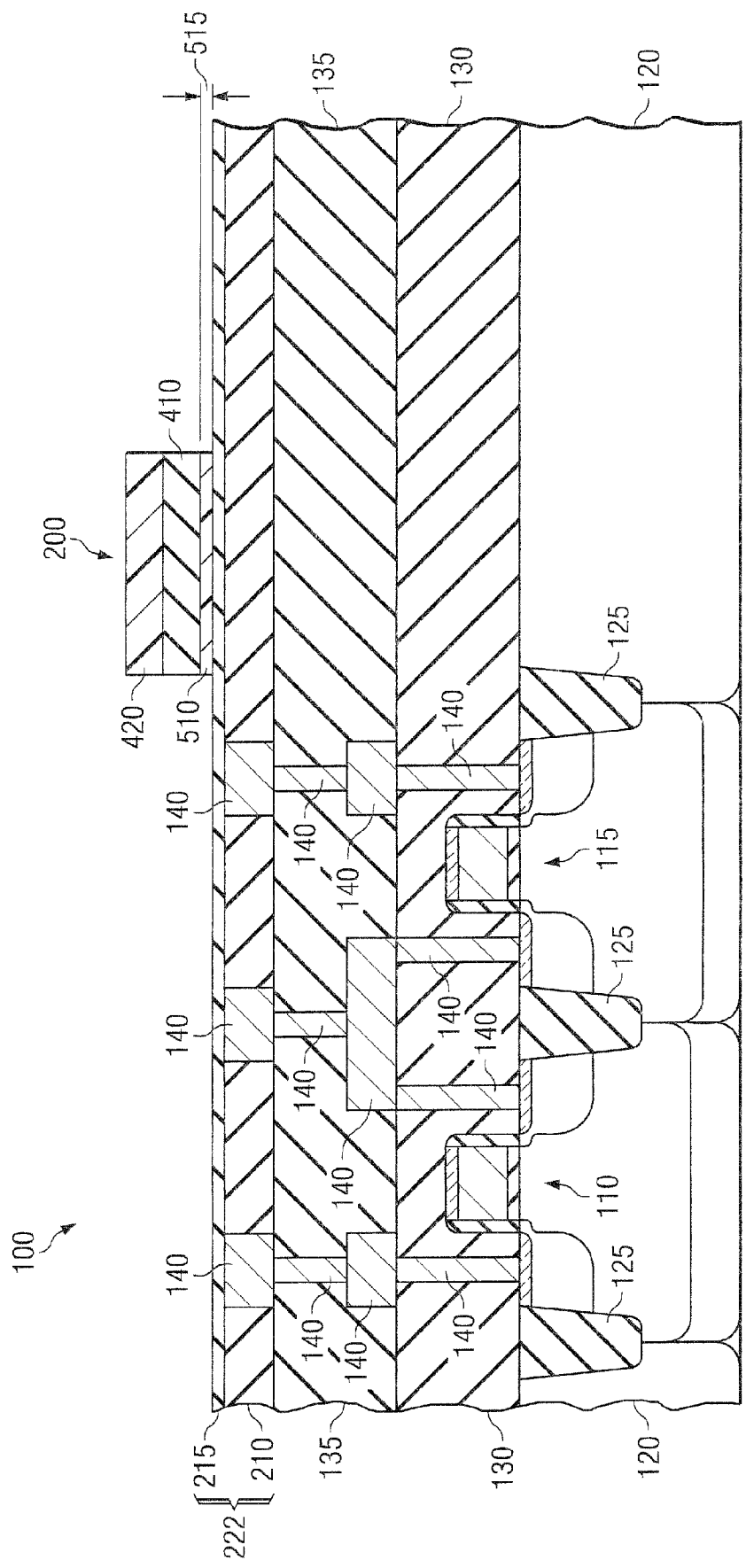

FIG. 5A shows a cross-sectional view of the device 100 after performing a second dry etch process on the resistive material layer 310 (FIG. 4A) to form a resistive body 510, and FIG. 5B shows a corresponding cutaway plan view, analogous to FIG. 4B, of the perimeter 520 of the resistive body 510.

Both the patterned photoresist layer 420 and insulative body 410 serve as masks for the second dry etch process used to form the resistive body 510. Because insulative body 410 and patterned photoresist layer 420 are overlying the resistive material layer 310 during the second dry etch process, the thickness 515 of the resistive body 510 can be substantially the same as the thickness 315 of the resistive material layer 310 (FIG. 3). Additionally, because the insulative body 410 serves as a mask, the resistive body 510 and the insulative body 410 have substantially identical perimeters 440, 520 (FIGS. 4B and 5B). That is, the perimeter 520 of resistive body 510 is within about 0.005 microns of the perimeter 440 of insulative body 410 at any point around the resistive body's perimeter 520. E.g., consider when the insulative body 410 has a length 450 and width 455 of about 10 and about 2 microns, respectively (FIG. 4B). In such cases, a length 530 of the resistive body 510 equals about 10±0.005 microns, and a width 535 of the resistive body 510 equals about 2±0.005 microns (FIG. 5B).

To avoid the formation of a resistive body 510 having jagged edges, the dry etch is preferably a sputter etch that uses a physical momentum transfer to remove those portions of the resistive layer 310 (FIG. 3) that are not covered by the insulative body 410 or the photoresist mask 420. As noted above in the context of the first dry etch, good sputtering efficiency can be achieved by imparting the second dry etch gases with a high molecular mass and selecting low flow rates.

Some embodiments of the second dry etch process include flowing $BCl_3$, $Cl_2$ and Ar at flow rates ranging from about 200 sccm or less. In some cases, higher flows rates undesirably increase the isotropic nature of the second dry etch. E.g., in some embodiments, $BCl_3$, $Cl_2$ and Ar flow rates range from about 5 to 200 sccm, about 20 to 200 sccm and about 10 to 200 sccm, respectively. In other embodiments $BCl_3$, $Cl_2$ and Ar flow rates range from about 10 to 20 sccm, about 50 to 60 sccm and about 10 to 20 sccm, respectively. In some cases, the second dry etch process includes a top RF power equal to about 450 W and a bottom RF power equal to about 300 W applied at a dry etch chamber pressure of about 10 mTorr. The second dry etch process can also include an electrostatic chuck temperature of about 60° C., and helium flow for wafer backside cooling at a pressure of about 10 Torr. In some embodiments, the second dry etch process consists essentially of a flow of $BCl_3$, $Cl_2$ and Ar (i.e., no other components in the gas flow delivered at 1 sccm or greater).

In some cases, the first and second dry etch processes are combined into a single dry etch process and performed using the same dry etching tool. E.g., in some cases the same process as described above for dry etching the resistive layer 310 (FIG. 3) can also be applied to remove the insulating layer 320. In such cases, the first and second etch processes are substantially identical to each other. In other cases, the same dry etching tool is used but the first and second dry etch processes are different from each other (e.g., the composition of the feed gases are different, or one or more of the gas flow, the top RF power equal or the bottom RF power differ by at least about 20 percent).

After forming the resistive body 510 as described in the context of FIGS. 5A-5B, damascene or non-damascene procedures can be performed to form interconnects that couple the resistive body 510 to at least one of the transistors 110, 115 or to another TFR of the device 100.

Figure 6D:
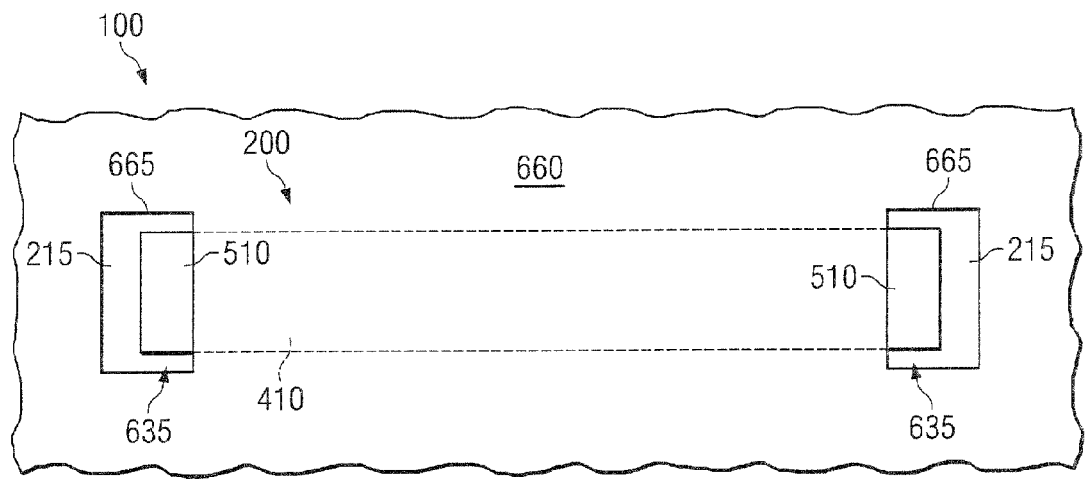
Figure 6A:
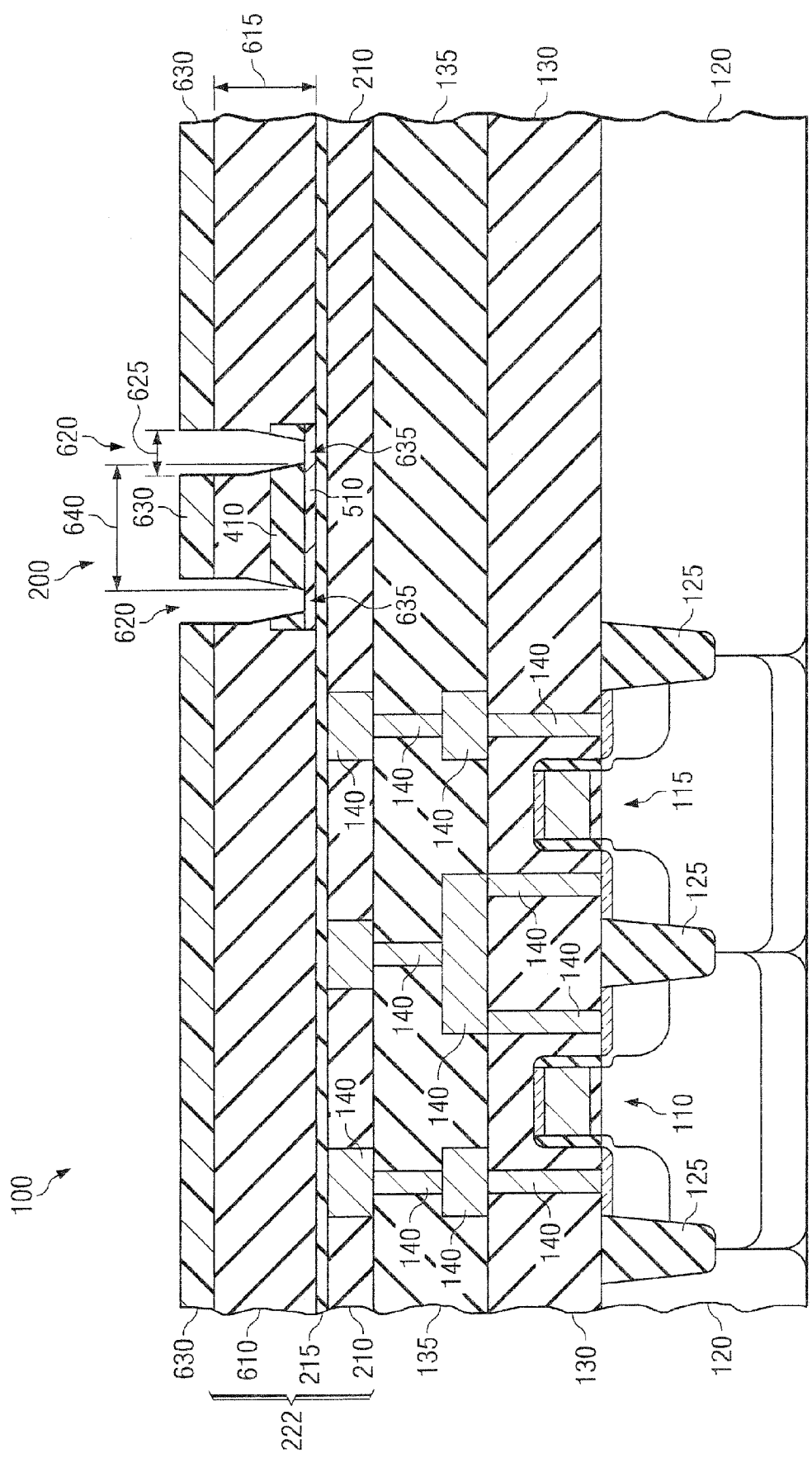
Figure 7A:
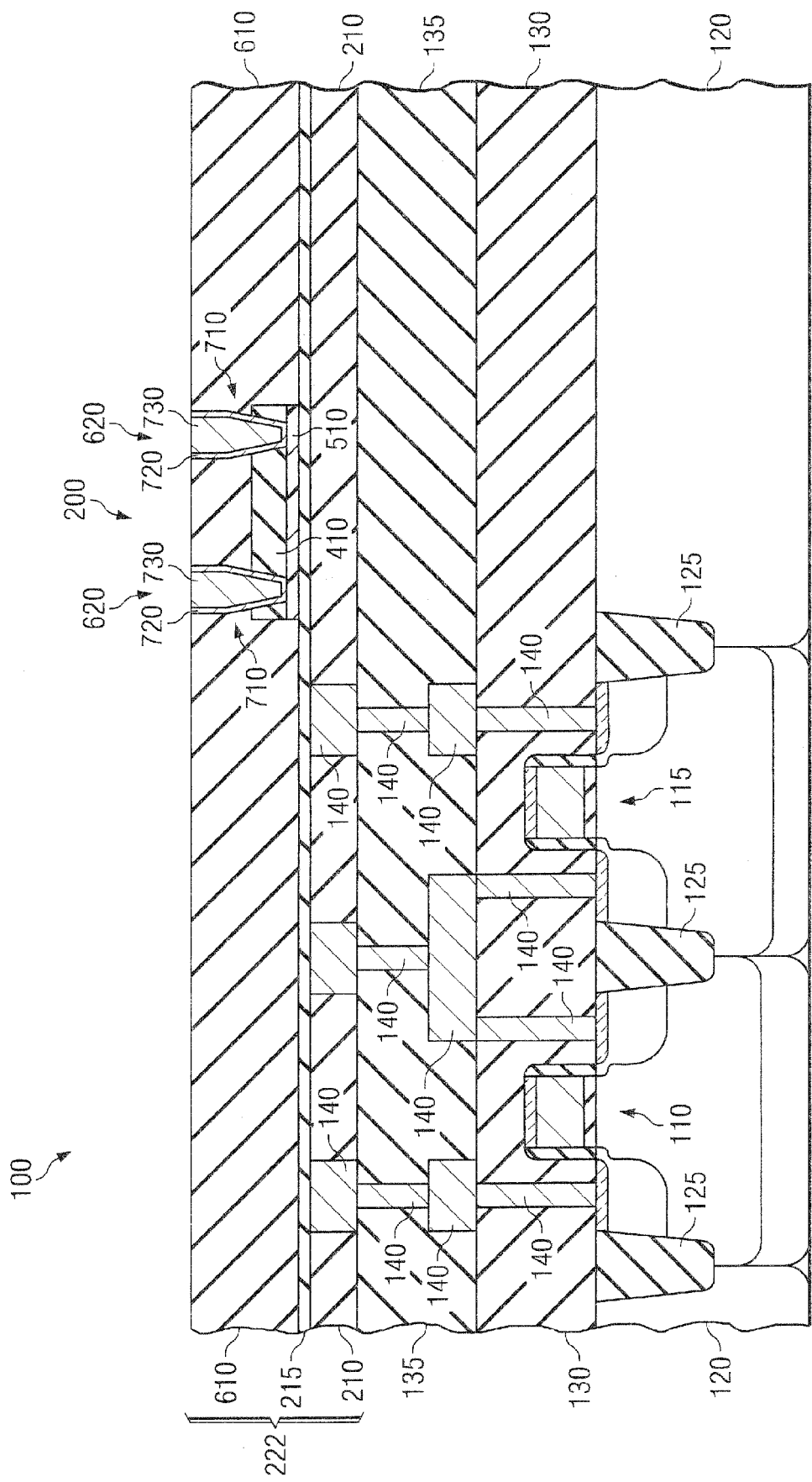

FIGS. 6A and 7A illustrate steps in an example damascene procedure to form interconnects 710. FIG. 6A shows a cross-sectional view of the device 100 after removing the patterned photoresist layer 420 (FIG. 5A) and covering the resistive body 510 and the insulative body 410 with a second insulating layer 610. The second insulating layer 610 can be deposited using the same procedures as described above for forming the insulating layer 210 and insulating cap layer 215. In some embodiments, such as shown in FIG. 6A, the second insulating layer 610 is part of the second IDL 222. In some cases, the thickness 615 of the second insulating layer 610 equals about 600 nm.

FIG. 6A also shows the device 100 after forming openings 620 in the second insulating layer 610 and the insulative body 410. The openings 620 can be formed using either a wet etch process or a dry etch process, or both. A wet etch process can be used in cases where the second IDL 222 has a thickness 615 of about 600 nm or less, and one or more lateral dimensions 625 of the openings equals about 1 micron or greater. In some embodiments, after forming a patterned resist layer 630 on the second insulating layer 610, the substrate 120 can be immersed in a wet oxide etch (e.g., about 10 volume percent of 49% HF in water) for about 4 minutes followed by a water rinse. Areas of the second insulating layer 610 and the insulative body 410 not covered by the patterned resist layer 630 are removed, thereby forming the openings 620.

As illustrated in FIG. 6A, the openings 620 can be located near to, and thereby expose, opposite ends 635 (e.g., the heads) of the resistive body 510. One skilled in the art would appreciate how the length 640 of the resistive body 510 that is between the openings 620 will affect the sheet resistance of the TFR 200. E.g., the length 640 can be changed by altering the location of the openings 620 along the resistive body 510, thereby changing the resistance of the TFR 200. In some embodiments, the length 640 of the resistive body 510 between the openings 620 ranges from about 1.5 to $1 \times 10^5$ microns.

FIG. 7A shows the device 100 shown in FIG. 6A after removing the photoresist layer 630 (FIG. 6A), e.g., using an organic solvent wash and oxidative ash, and then filling the openings 620 located over the resistive body 510 with a metal to form interconnects 710 (e.g., metal vias). Forming the interconnects 710 can include conformally coating the openings 620 with a barrier layer 720 (e.g. TiW or TaN) before depositing a metal layer 730 (e.g., Al or Cu). The barrier layer 720 helps to prevent the diffusion of atoms of the metal layer 730 into the second insulating layer 610 or other components of the device 100. The barrier layer 720 and metal layer 730 can be deposited using PVD, CVD or other processes well known to those skilled in the art.

Figure 6B:
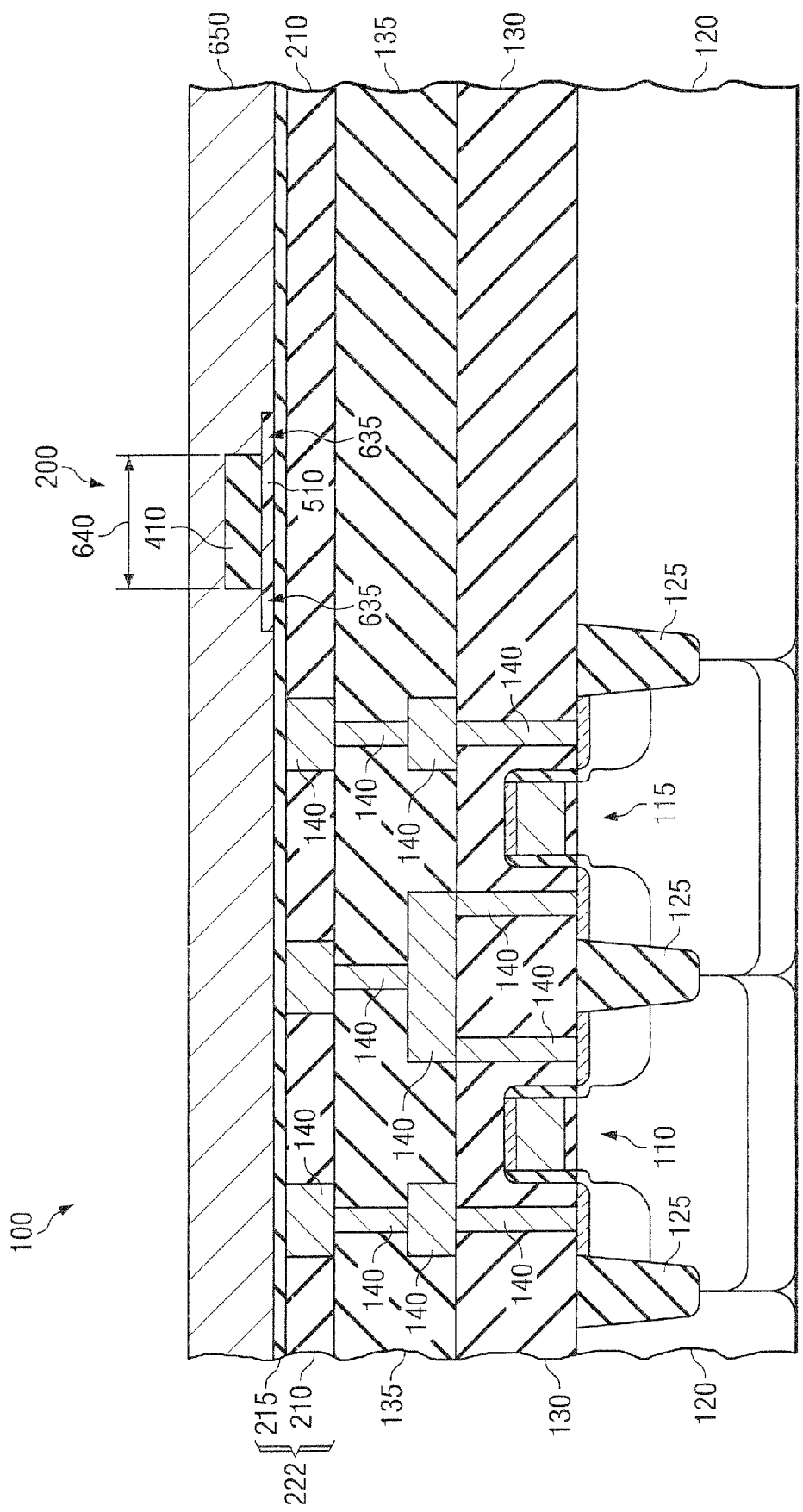
Figure 7B:
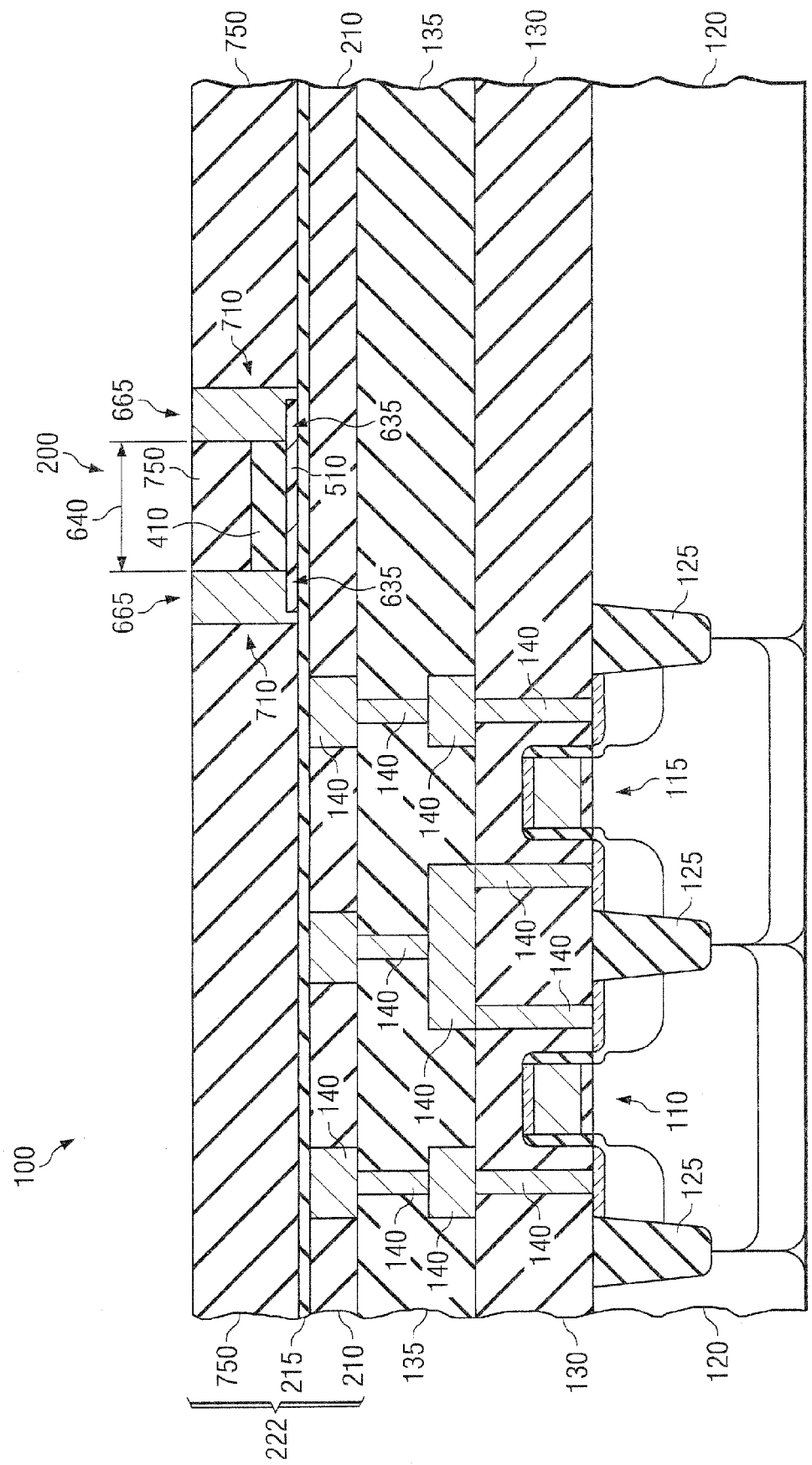

FIGS. 6B and 7B illustrate selected stages in an alternative example non-damascene procedure to form the interconnects 710. FIG. 6B shows a cross-sectional view of the device 100 after removing the patterned photoresist layer 420 (FIG. 5A) and patterning and removing portions of the insulative body 410 to expose the opposite ends 635 of the resistive body 510. E.g. photolithography and wet or dry etching processes, similar to that described in the context of FIGS. 6A and 7A, can be used to remove end portions of the insulative body 410. FIG. 6B also shows the device after a full deposition (e.g., a blanket deposition) of a metal layer 650 (e.g., an aluminum layer) over the substrate 120. The metal layer 650 can be deposited using PVD, CVD or other processes well known to those skilled in the art. As illustrated in FIG. 6B the metal layer 650 is deposited on the exposed opposite ends 635 of the resistive body 510 and the remaining portions of the insulative body 410.

FIG. 7B shows the device 100 shown in FIG. 6B after patterning the metal layer 650 (FIG. 6B) to form the interconnects 710. E.g., photolithography and a dry or wet etch process can be used to remove portions of the metal layer 650 (FIG. 6B) that do not form the interconnects 710. Thereafter an insulating layer 750 can be deposited over the substrate 120, similar to that described for the insulating layer 610 (FIG. 6A) so as to cover the TFR 200 and interconnects 710. CMP or wet etching processes similar to that discussed above can then be used to remove portions of the insulating layer 750 so as to expose the interconnects 710.

Figure 6C:
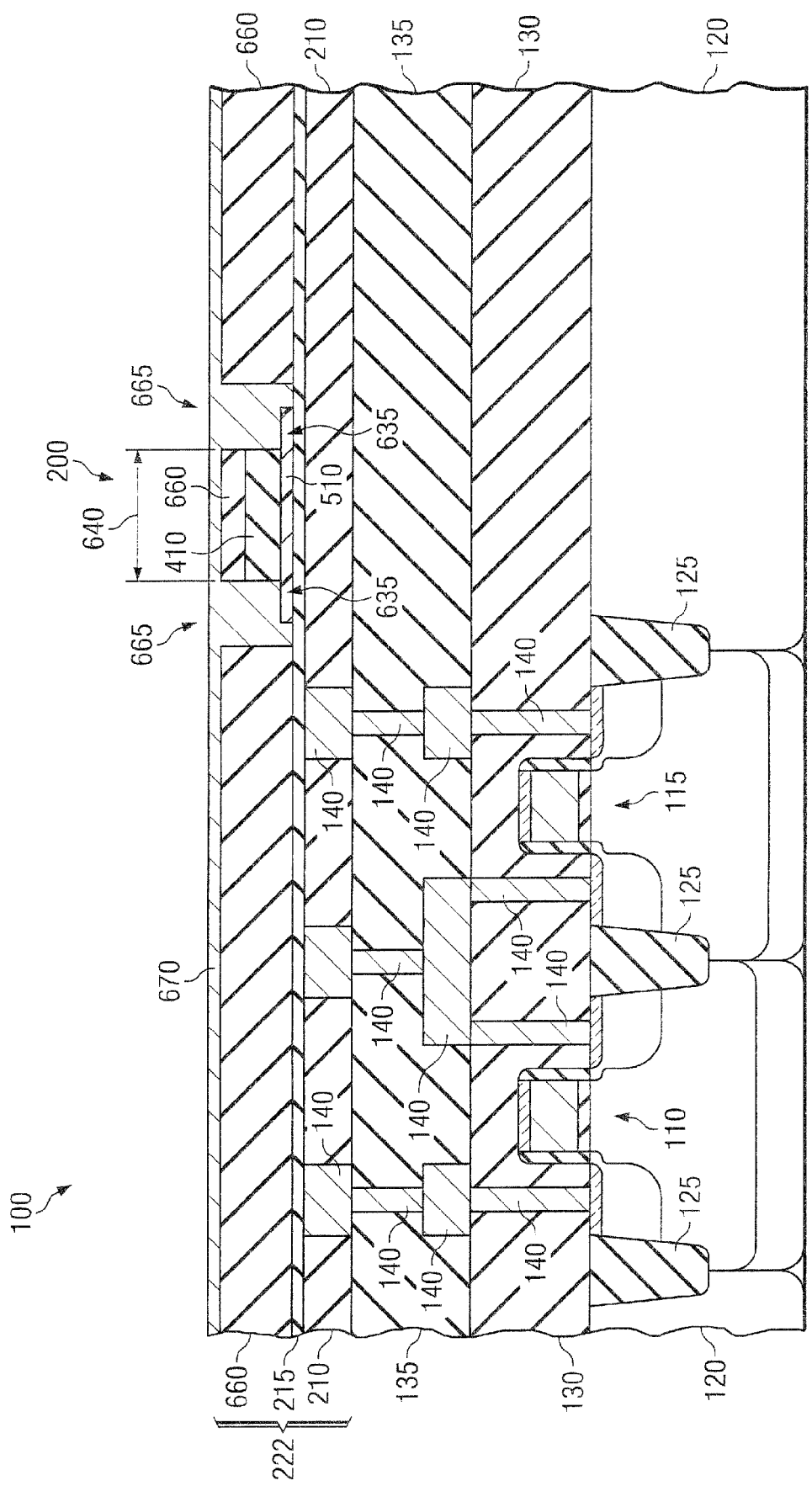
Figure 7C:
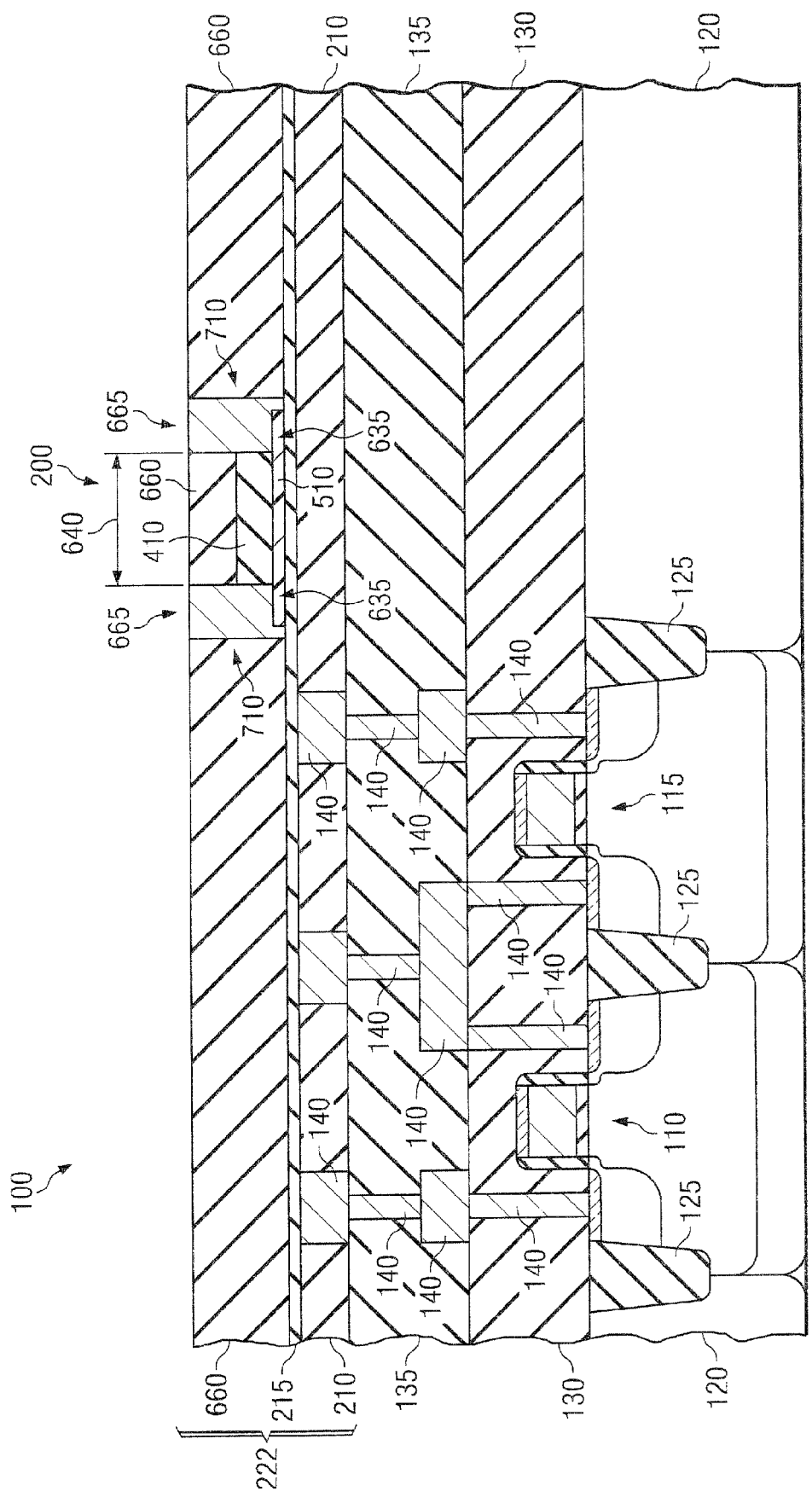

FIGS. 6C, 6D and 7C illustrate selected stages in a second alternative example non-damascene procedure to form the interconnects 710. FIG. 6C shows a cross-sectional view of the device 100 after removing the patterned photoresist layer 420 (FIG. 5A) and after depositing an insulating layer 660 (using procedures similar to depositing insulating layer 610 in FIG. 6A or insulating layer 750 in FIG. 7B) over the substrate 120. The insulating layer 660 covers and surrounds the insulative body 410 and resistive body 510. FIG. 6C also shows the device 100 after patterning the insulative body 410 and insulating layer 660 to forming openings 665 therein that expose the opposite ends 635 of the resistive body 510. FIG. 6C further shows the device after a full deposition (e.g., a blanket deposition) of a metal layer 670 (e.g., similar to the deposition of metal layer 650 in FIG. 6B) over the substrate 120. The metal layer 670 fills the openings 665, and is one the opposite ends 635 of the resistive body 510.

The openings 665 can be formed through the insulative body 410 and insulating layer 660 using substantially the same techniques to form the openings 620 as described in the context of FIG. 6A. The openings 665 can expose portions of the insulating cap layer 215. E.g., FIG. 6D presents a plan view of the device 100 after forming the openings 665 but before depositing the metal layer 670 (FIG. 6C). Portions of the insulating layer 660 are not shown so that the underlying insulative body 410 can be depicted.

FIG. 7C shows the device 100 depicted in FIG. 6C after removing portions (e.g., using CMP or wet etching processes similar to that discussed above) of the metal layer 670 (FIG. 6C) that lay outside of the openings 665 (FIG. 6D) to thereby form the interconnects 710.

The second non-damascene procedure shown in FIGS. 6C, 6D and 7C has an advantage over the non-damascene procedure shown in FIGS. 6B and 7B. Because the resistive body 510 is enclosed by the insulating layer 660, except for the ends 635 exposed by forming the openings 665, the resistive body 510 is protected against oxidation during the processes to pattern and remove the metal layer 670 (FIG. 6C). As noted above oxidation of the resistive body 510 can alter its resistance thereby resulting is a higher-than-desired 1/f noise in the TFR 200.

Figure 8:
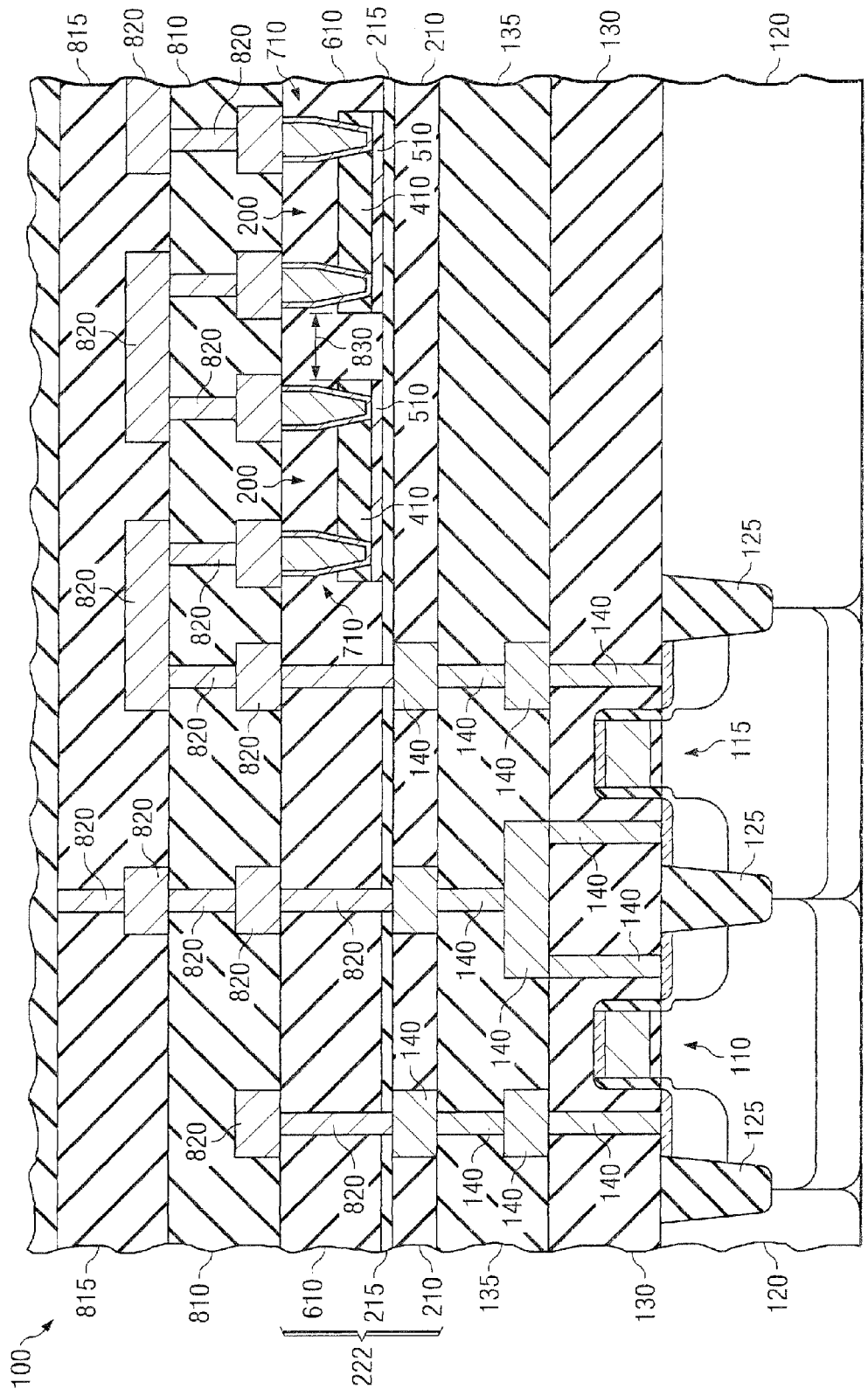

FIG. 8 shows a cross-sectional view of the device 100 depicted in FIG. 7A, after depositing one or more additional interlayer insulating layers 810, 815 (e.g., third and fourth IDLs) on the semiconductor substrate 120. The transistors 110, 115 and the TFR 200 are covered by at least one of the insulating layers 810, 815.

FIG. 8 also shows the device 100 after forming interlayer interconnects 820 through one or more of the interlayer insulating layers 810, 815. The composition and method of depositing the insulating layers 810, 815 and interconnects can be substantially the same as described for the PMD layer 130 and IDL 135, and interconnects 140 as described above in the context of FIG. 1. The interlayer interconnects 820 couple the transistors 110, 115 to each other, or to at least one TFR 200, of the device 100. The interlayer interconnects 820 formed in insulating layer 610 could be formed at the same time as the interconnects 710 that contact the TFR 200, if desired.

Analogous procedures could be followed to deposit additional interlayer insulating layers and interconnects for the devices 100 depicted in FIGS. 7B and 7C.

As further illustrated in FIG. 8, the device 100 can have a plurality of the TFRs 200, which are formed on the substrate 120, substantially as described above in the context of FIGS. 2-7C. The interconnects 710 can couple the resistive body 510 to other resistive bodies 510 of other TFRs 200, to form e.g., a resistive network of TFRs.

Because a dry etch process is used to form the TFR, it is possible to reduce the space between adjacent TFRs. For instance, as shown in FIG. 8, at least two adjacent TFRs 200 can be separated by distance 830 of about 4 microns or less. In some embodiments, the separation distance 830 between adjacent resistive bodies 510 is about 0.3 to 0.4 microns. This is in contrast to conventionally formed TFRs, which are not formed with such small separation distances. Conventionally formed TFRs have larger separation distances (e.g., greater than about 4 microns) because the resistive bodies of such TFRs are formed using a wet etch process, instead of the dry etch process of the present disclosure.

FIG. 8 illustrates another embodiment of the present disclosure, a semiconductor device 100. In some embodiments, the semiconductor device 100 is, or includes, an integrated circuit. The device 100 can be manufactured by any of the above-described processes. The device 100 comprises transistors 110, 115 on the semiconductor substrate 120, one or more TFRs 200 on the substrate 120. At least one of TFRs 200 include a resistive body 510 and an insulative body 410 on the resistive body 510. The resistive body 510 and insulative body 410 have substantially identical perimeters 440, 520 (FIGS. 4B and 5B).

Those skilled in the art to which the disclosure relates will appreciate that other and further additions, deletions, substitutions, and modifications may be made to the described example embodiments, without departing from the disclosure.

What is claimed is:

1. . A method of manufacturing a semiconductor device, comprising:
   forming transistors on a semiconductor substrate;
   forming a pre-metal insulating layer over the transistors;
   forming first metal contacts through the pre-metal insulating layer into contact with the transistors;
   forming at least one interlevel dielectric layer over the first metal contacts and pre-metal insulating layer; and
   forming one or more thin film resistors over the at least one interlevel dielectric layer;
   wherein at least one thin film resistor is fabricated by a process that includes:
   forming an NiCr resistive material layer over the at least one interlevel dielectric layer;

forming an insulating hard mask layer on the resistive material layer;

performing a first dry etch process to pattern the hard mask insulating layer to form an insulative body;

performing a second dry etch process using the insulative body as a hard mask to pattern the resistive material layer to form a resistive body, the insulative body remaining over the resistive body to prevent oxidation of the resistive body;

forming another insulating layer over the insulative body and over the resistive body; and forming openings through the another insulating layer and the insulative body down to opposite ends of the resistive body; and filling the openings with metal to form interconnects, wherein said interconnects couple said resistive body to at least one of said transistors or another of said thin film resistors.

2. The method of claim 1, wherein a plurality of thin film resistors are formed by the process used to form the at least one thin film resistor, and at least two adjacent ones of the thin film resistors are separated by a distance of about 4 microns of less.

3. The method of claim 1, wherein the second dry etch process comprises sputter etching the resistive material including: flowing BCl3 at a flow rate of about 30 to 50 sccm and flowing SF6 at a flow rate of about 30 to 50 sccm.

4. The method of claim 1, wherein the first dry etch process includes flowing $BCl_3$ and $SF_6$, at flow rates of 200 sccm or less, and the second dry etch process includes flowing $BCL_3$, $Cl_2$ and Ar at flow rates of 200 sccm or less.

5. The method of claim 4, wherein the first dry etch process includes flowing $BCl_3$ and $SF_6$, at flow rates ranging from about 10 to 200 sccm and about 10 to 200 sccm, respectively, and the second dry etch process includes flowing $BCL_3$, $Cl_2$ and Ar at flow rates ranging from about 10 to 200 sccm, about 10 to 200 sccm and about 10 to 200 sccm, respectively.

6. The method of claim 5, wherein the first dry etch process includes flowing $BCl_3$ and $SF_6$, at flow rates ranging from about 30 to 50 sccm and about 35 to 45 sccm, respectively, and the second dry etch process includes flowing $BCL_3$, $Cl_2$ and Ar at flow rates ranging from about 10 to 20 sccm, about 50 to 60 sccm and about 10 to 20 sccm, respectively.

7. The method of claim 1, wherein the first dry etch process consists essentially of a flow of $BCL_3$ and SF6, and the second dry etch process consists essentially of a flow of $BCL_3$, $Cl_2$ and Ar.

8. The method of claim 1, wherein the resistive material layer has a thickness of about 100 nanometers or less, and the insulating layer has a thickness of about 20 to 80 nanometers.

9. The method of claim 1, wherein forming the NiCr resistive material layer over the at least one interlevel dielectric layer comprises forming an insulating cap layer over the at least one interlevel dielectric layer to provide a planar surface; and forming the NiCr resistive material layer on the planar surface provided by the insulating cap layer.

10. The method of claim 9, wherein forming the openings through the another insulating layer and the insulative body comprises forming a patterned resist layer over the another insulating layer, performing a wet etch of the another insulating layer and the insulative body through the patterned photoresist layer, and removing the patterned photoresist layer following the wet etch.

11. The method of claim 10, wherein forming the insulating hard mask layer comprises depositing TEOS.

12. The method of claim 11, wherein forming the insulating cap layer comprises depositing TEOS.

13. The method of claim 12, wherein said second dry etch process comprises a sputter etch.

14. A method of manufacturing a semiconductor device, including forming a thin film resistor by a process comprising:

forming an insulating cap layer to provide a planar surface over a semiconductor substrate;

forming an NiCr resistive material layer on the insulating cap layer;

annealing the NiCr resistive material layer;

forming an insulating hard mask layer over the NiCr resistive material layer to a thickness to prevent oxidation of the NiCr resistive material layer;

patterning the insulating hard mask layer to form an insulative body;

patterning the NiCr layer using dry sputter etching to form a resistive body with the insulating body serving as a hard mask;

forming another insulating layer over the insulative body and over the resistive body;

forming a patterned resist layer over the another insulating layer;

forming openings through the another insulating layer and insulative body, down to ends of the resistive body, using a wet etch; and removing the patterned photoresist following the wet etch.

* * * * *